United States Patent
Shimizu et al.

(10) Patent No.: US 7,754,515 B2
(45) Date of Patent: Jul. 13, 2010

(54) COMPOUND SEMICONDUCTOR AND METHOD FOR PRODUCING SAME

(75) Inventors: Masaya Shimizu, Niihama (JP);
Makoto Sasaki, Tsukuba (JP);
Yoshihiko Tsuchida, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 10/558,427

(22) PCT Filed: May 28, 2004

(86) PCT No.: PCT/JP2004/007792

§ 371 (c)(1),
(2), (4) Date: Nov. 29, 2005

(87) PCT Pub. No.: WO2004/107460

PCT Pub. Date: Dec. 9, 2004

(65) Prior Publication Data

US 2006/0243960 A1    Nov. 2, 2006

(30) Foreign Application Priority Data

May 30, 2003  (JP) .............................. 2003-154745

(51) Int. Cl.
*H01L 33/00*    (2010.01)
*H01L 21/20*    (2006.01)
(52) U.S. Cl. .............................. 438/47; 438/94; 257/97
(58) Field of Classification Search .................. 438/47, 438/94; 257/97
See application file for complete search history.

(56) References Cited

U.S. PATENT DOCUMENTS

| 6,040,588 | A  | * | 3/2000  | Koide et al. .................. 257/15 |
| 6,346,720 | B1 |   | 2/2002  | Iyechika et al. |
| 6,472,298 | B2 |   | 10/2002 | Iyechika et al. |

FOREIGN PATENT DOCUMENTS

| JP | 08-316528 A   | 11/1996 |
| JP | 09-036429 A   | 2/1997  |
| JP | 2000-58980 A  | 2/2000  |
| JP | 2001-77415 A  | 3/2001  |
| JP | 2001-102633 A | 4/2001  |
| JP | 2001-196632 A | 7/2001  |
| WO | WO 01/78157 A | 10/2001 |

OTHER PUBLICATIONS

Nakamura et al., "High-brightness InGaN blue, green and yellow light-emitting diodes with quantum well structures," Jpn. J. Appl. Phys., vol. 34, pp. L797-L799 (1995).

* cited by examiner

*Primary Examiner*—Jerome Jackson, Jr.
(74) *Attorney, Agent, or Firm*—Fitch, Even, Tabin & Flannery

(57) ABSTRACT

A group III-V compound semiconductor comprising a single quantum well structure which has two barrier layers and a quantum well layer represented by the formula: $In_xGa_yAl_zN$ (wherein x+y+z=1, 0<x<1, 0<y<1, and 0≦z<1) between the barrier layers, wherein a multiple quantum well structure having repeatedly the barrier layers and the quantum well layer is formed, a ratio of an average mole fraction of InN in the multiple quantum well layer, which is measured by x-ray diffraction, to a mole fraction of InN calculated from a wavelength of light emitted from the group III-V compound semiconductor due to current injection is not more than 42.5%.

6 Claims, 3 Drawing Sheets

US 7,754,515 B2

COMPOUND SEMICONDUCTOR AND METHOD FOR PRODUCING SAME

This Application is the National Phase of International Application No. PCT/JP2004/007792 filed May 28, 2004, which designated the U.S. and was not published under PCT Article 21(2) in English, and this application claims, via the aforesaid International Application, the foreign priority benefit of and claims the priority from Japanese Application No. 2003-154745, filed May 30, 2003, the complete disclosures of which are incorporated herein by reference.

TECHNICAL FIELD

The present invention relates to a group III-V compound semiconductor including a quantum well structure having two barrier layers and a quantum well layer represented by the formula: $In_xGa_yAl_zN$ (wherein x+y+z=1, 0<x<1, 0<y<1, 0≦z<1) between the barrier layers.

BACKGROUND ART

As raw materials for light-emitting device such as an ultraviolet, blue or green light-emitting diode as well as an ultraviolet, blue or green laser diode, there have been known group III-V compound semiconductors represented by the formula: $In_aGa_bAl_cN$ (wherein a+b+c=1, 0≦a≦1, 0≦b≦1, 0≦c≦1). Hereinafter, a, b and c in the formula may be referred to as a mole fraction of InN, a mole fraction of GaN and a mole fraction of AlN, respectively. Among the group III-V compound semiconductors, those having an InN mole fraction of 5% or more are particularly important in applications for display, because they allow adjustment of wavelength of emitted light within the visible light region depending on the mole fraction of InN.

Although an attempt to grow a group III-V compound semiconductor layer on substrate such as sapphire, GaAs, ZnO and the like has been made, no crystals having a sufficiently high quality have been obtained, due to the fact that its lattice constant and chemical property are considerably different from those of the compound semiconductor. Therefore, an attempt to obtain an excellent crystal has been made by growing the compound semiconductor on GaN, which has lattice constant and chemical property similar to those of the compound semiconductor (JP-B-1980-3834).

In addition, although it is reported that a light-emitting device having a high efficiency can be obtained by forming a quantum well structure including a semiconductor represented by the formula: $In_aGa_bAl_cN$ (wherein a+b+c=1, 0<a<1, 0<b<1, 0≦c<1)(JP 3,064,891), it is not always sufficiently acceptable in brightness.

Further, there has been known another process for producing a semiconductor, in which an InGaN layer is grown on a Si-doped GaN at 660 to 780° C., a GaN is grown after an interrupting growth for 5 to 10 seconds, the InGaN layer and GaN are repeatedly grown under such condition to form a multiple quantum well structure, and then a p-GaN layer is grown at 1040° C. It has also been known, however, that the InGaN layer is destructed during growing the p-GaN layer and In metal are deposited, thereby resulting significant decrease in brightness (Journal of Crystal Growth, 248, page 498 (2003))

DISCLOSURE OF THE INVENTION

The purpose of the present invention is to provide a group III-V compound semiconductor which is capable of forming a light-emitting device having a high brightness, a process for producing a group III-V compound semiconductor and a use of the same.

As the result of studies under such circumstances, the inventors have found that a compound semiconductor wherein a ratio of an average mole fraction of InN in a quantum well layers, which is measured by x-ray diffraction, to a mole fraction of InN calculated from the wavelength of light emitted due to current injection is a specific value, that is not more than 42.5%, is capable of forming a light-emitting device having a high brightness, and that the compound semiconductor capable of forming a light-emitting device having a high brightness can be obtained by interrupting growth between completion of the quantum well layer growth and beginning of the barrier layer growth, at a temperature of growing the quantum well layer for 10 minutes or more, or at a temperature higher than the temperature of growing the quantum well layer and thus have completed the invention.

The present invention provides [1] a group III-V compound semiconductor comprising;

a multiple quantum well structure which includes at least two quantum well structures having two barrier layers and a quantum well layer represented by the formula: $In_xGa_yAl_zN$ (wherein x+y+z=1, 0<x<1, 0<y<1, and 0≦z<1) between the barrier layers, wherein a ratio of an average mole fraction of InN in the quantum well layer, which is measured by x-ray diffraction, to a mole fraction of InN calculated from a wavelength of light emitted from the group III-V compound semiconductor due to current injection is not more than 42.5%.

The present invention provides [2] a group III-V compound semiconductor comprising;

a single quantum well structure having two barrier layers and a quantum well layer represented by the formula: $In_xGa_yAl_zN$ (wherein x+y+z=1, 0<x<1, 0<y<1, and 0≦z<1) between the barrier layers, wherein a multiple quantum well structure having repeatedly the set of barrier layers and the quantum well layer is formed, a ratio of an average mole fraction of InN in the multiple quantum well layer, which is measured by x-ray diffraction, to a mole fraction of InN calculated from a wavelength of light emitted from the group III-V compound semiconductor due to current injection is not more than 42.5%.

The invention provides [3] a process for producing group III-V compound semiconductor including two barrier layers and a quantum well structure having a quantum well layer represented by the formula: $In_xGa_yAl_zN$ (wherein x+y+z=1, 0<x<1, 0<y<1, and 0≦z<1) between the barrier layers comprising a step of interrupting growth between completion of the quantum well layer growth and beginning of the barrier layer growth, at a temperature of growing the quantum well layer for 10 minutes or more, or at a temperature higher than the temperature of growing the quantum well layer.

Figure 1:
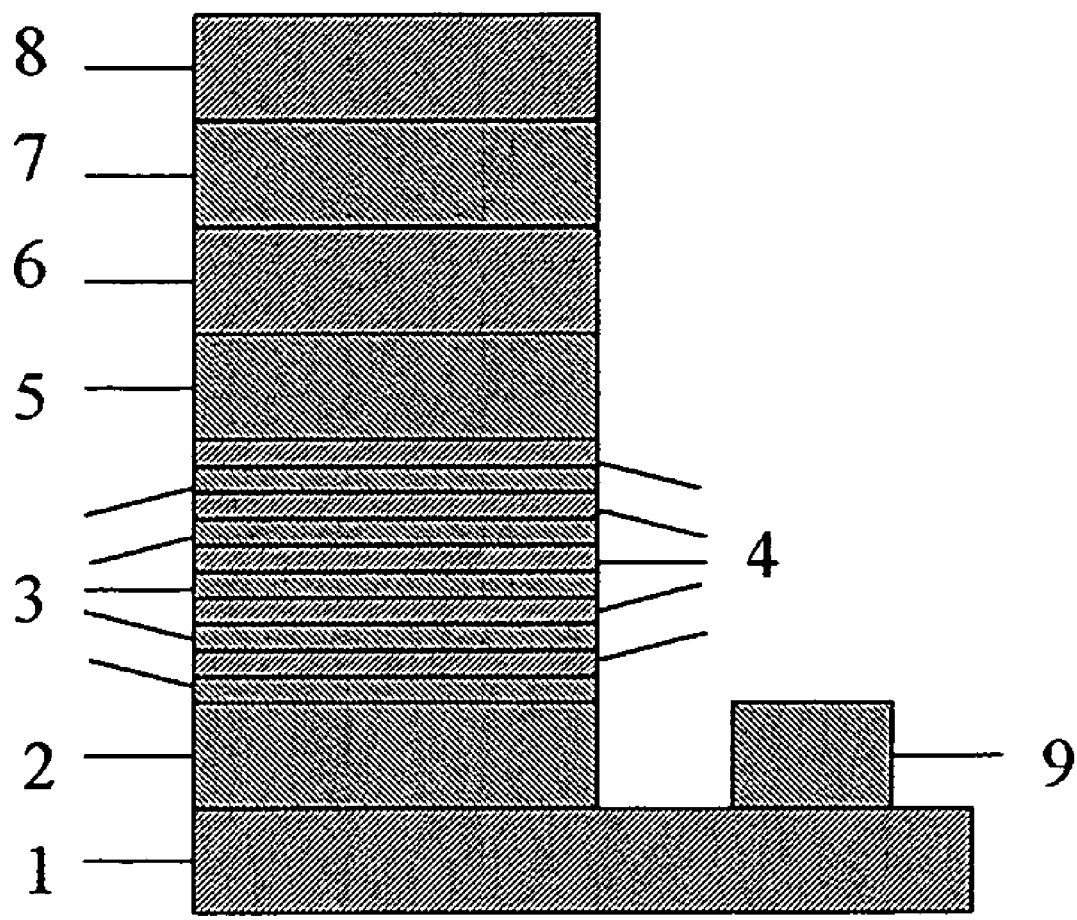
FIG. 1 shows a cross section of a structure of a device according to an embodiment of the present invention.

In the drawings, numerical symbols have the following meanings;
1 an n-type GaN layer,
2 an undoped GaN layer,
3 a GaN layer (a barrier layer),
4 an InGaN layer (a quantum well layer),
5 a GaN layer (a barrier layer, the first cap layer),
6 a Mg-doped AlGaN layer (the second cap layer),
7 a p-type GaN layer,
8 a p-electrode, and
9 an n-electrode.

MODE FOR CARRYING OUT THE INVENTION

The group III-V compound semiconductor of the invention includes a quantum well structure having two barrier layers and a quantum well layer represented by the formula: $In_yGa_{y'}Al_zN$ (wherein $x+y+z=1$, $0<x<1$, $0<y<1$, $0 \leqq z<1$) between the barriers.

The quantum well layer has a thickness of usually from 5 to 90 Å, preferably from 10 to 70 Å, more preferably from 15 to 65 Å.

Further, the quantum well layer may or may not be doped with impurity. In the quantum well layer doped with impurity, the concentration thereof is usually $10^{21}$ cm$^3$ or less. The quantum well layer with too high concentration may have lower crystallinity.

The barrier layer is usually a group III-V compound semiconductor represented by the following formula $In_aGa_bAl_cN$ (wherein $a+b+c=1$, $0 \leqq a<1$, $0 \leqq b \leqq 1$, $0 \leqq c \leqq 1$). The barrier layer may or may not be doped with impurity. Examples of the impurity include Si, Zn, Mg, O and the like. The barrier layer may be doped with a plurality of these elements. When the barrier layer is doped with the impurity, an amount of the impurity is usually from $10^{16}$ cm$^3$ to $10^{21}$ cm$^3$. The two barrier layers may be same or different.

The barrier layer has a thickness of usually from 30 to 1,000 Å, preferably from 50 and 500 Å, more preferably from 100 to 300 Å.

The quantum well structure has the quantum well layer and the barrier layers described above. In the present invention, there may be a single quantum well structure or a multiple quantum well structure having at least two quantum well structures, preferably the multiple quantum well structure.

When a multiple quantum well structure is included, the plurality of quantum well layers may be same or different, and also a plurality of barrier layers may be same or different. A structure in which the same quantum well layers and the same barrier layers are alternately repeated is preferably included.

The group III-V compound semiconductor of the present invention includes the quantum well structure described above. When The group III-V compound semiconductor includes a multiple quantum well structure, a ratio of an average mole fraction of InN in the multiple quantum well layer, which is measured by x-ray diffraction, to a mole fraction of InN calculated from a wavelength of light emitted from the group III-V compound semiconductor due to current injection is not more than 42.5%. When the group III-V compound semiconductor has a single quantum well structure, in case that a multiple quantum well structure having the barrier layer and the quantum well layer is formed repeatedly in plural times, a ratio of an average mole fraction of InN in the multiple quantum well structure, which is measured by x-ray diffraction, to a mole fraction of InN calculated from a wavelength of light emitted from the group III-V compound semiconductor due to current injection is not more than 42.5%.

The ratio thereof is preferably not more than 40%, more preferably 35%, further preferably 30%.

The average mole fraction of InN may be measured by X-ray diffraction. For example it may be obtained by a method of measuring a mole fraction of InN from satellite reflection of super lattice in the multiple quantum well structure and calculating the average mole fraction of InN in the quantum well layer from a portion of thickness of the quantum well layer and thickness of the barrier layers.

The mole fraction of InN calculated from a wavelength of light due to current injection may be obtained by the following method.

The wavelength λ (nm) of light emitted from a compound semiconductor used in a light-emission device may be represented by the equation:

$$\lambda = 1,240/Eg \qquad (1)$$

wherein Eg (eV) is a band gap energy of the semiconductor.

The band cap energy of the compound semiconductor may be calculated from a mole fraction thereof. For example, in case of $In_xGa_{1-x}N$, which is composed of InN and GaN, a band gap energy of InN is 0.8 eV, a band gap energy of GaN is 3.42 eV, and therefore the band gap energy of the compound semiconductor (Eg) may be represented by the equation:

$$Eg = 0.8x + 3.42(1-x) \qquad (2)$$

Accordingly, the mole fraction of InN (x) in the compound semiconductor may be calculated from (1) and (2) as the equation:

$$x = (3.42 - (1,240/\lambda))/(3.42 - 0.8)$$

When the wavelength of emitted light is 470 nm, x is 0.298.

The quantum well structure having the mole fraction of InN described above may be prepared by heat treatment. The quantum well structure is grown usually at from 650 to 850° C. and the barrier layer is grown usually at from 650 to 1,000° C., The quantum well structure may be prepared, for example, by interrupting growth between completion of the quantum well layer growth and beginning of the barrier layer growth, at a temperature of growing the quantum well layer for 10 minutes or more, or at a temperature higher than the temperature of growing the quantum well layer.

When interrupting growth is made at a temperature of growing the quantum well layer, interrupting time is preferably 12 minutes or more, more preferably 15 minutes or more, and usually 60 minutes or less, though there is no particular upper limit.

When interrupting growth is made at a temperature higher than temperature of growing the quantum well layer, interrupting temperature is preferable about 10° C. higher than a temperature of growing the quantum well layer. The interrupting temperature is more preferably 30° C. higher, further preferably 50° C. higher than that. Maximum interrupting temperature is usually a temperature about 100° C. higher than a temperature of growing the quantum well layer, though there is no particular upper limit. Depending on the temperature, interrupting time is usually 1 minute or more, preferably 3 minutes or more, more preferably 5 minutes or more, further preferably 7 minutes or more. The upper limit thereof is usually about 60 minutes, through there is no particular upper limit. The interrupting time is preferably a period between completion of the quantum well layer growth and beginning of the barrier layer growth.

During interrupting growth, a group III raw material feeding is stopped. A group V raw material and a carrier gas may or may not be fed. The group V raw material is preferably fed, and the feeding prevent nitrogen reduction from quantum well layer during growth.

The average mole fraction of InN in the quantum well layer, which is obtained by analyzing the multiple quantum well structure by X-ray diffraction, may be lowered due to the heat treatment, and the quantum well structure having the average mole fraction of InN described above may be formed.

The group III-V compound semiconductor of the present invention may be prepared under conventional conditions except conditions for interrupting growth.

A structure of a device including the group III-V compound semiconductor of the present invention is illustrated in FIG. 1. In the example in FIG. 1, an undoped GaN layer 2 is placed on an n-type GaN layer 1. A quantum well structure has a layer which a GaN layers 3 as barrier layers, an InGaN layers 4 as quantum well layers are alternately placed, and a GaN layer 5 (the first cap layer) is placed on the substrate as a barrier layer. A Mg-doped AlGaN layer 7 (the second cap layer), and a p-type GaN layer 7 are placed in order. An n-electrode 9 is placed on the n-type GaN layer 1, a p-electrode 8 is placed on the p-type GaN layer 7, and application of voltage thereto in forward direction subjects the current injection to the multiple quantum well layer, allowing them to emit light.

Examples of method for producing the group III-V compound semiconductor described above include molecular beam epitaxy (hereinafter being abbreviated as MBE), metal organic vapor phase epitaxy (hereinafter being abbreviated as MOVPE), hydride vapor phase epitaxy (hereinafter being abbreviated as HVPE) and the like. Among these methods MOVPE is important, because it enable to grow a semiconductor uniformly in widespread area.

In the method of MOVPE, raw materials is as follows:

Examples of group III raw materials include trialkyl gallium represented by the formula: $R_1R_2R_3Ga$ ($R_1$, $R_2$ and $R_3$ represent lower alkyl groups) such as trimethyl gallium [$(CH_3)_3Ga$, hereinafter being abbreviated as TMG], triethyl gallium [$(C_2H_5)_3Ga$, being abbreviated as TEG] and the like; trialkyl aluminum represented by the formula: $R_1R_2R_3Al$ ($R_1$, $R_2$ and $R_3$ represent lower alkyl groups) such as trimethyl aluminum [$(CH_3)_3Al$, hereinafter being abbreviated as TMA], triethyl aluminum [$(C_2H_5)_3Al$, hereinafter being abbreviated as TEA], triisobutyl aluminum [$(i-C_4H_9)_3Al$] and the like; trimethylamine alane [$(CH_3)_3N:AlH_3$]; trialkyl indium represented by the formula: $R_1R_2R_3In$ ($R_1$, $R_2$ and $R_3$ represent lower alkyl groups) such as trimethyl indium [$(CH_3)_3In$, hereinafter being abbreviated as "TMI"], triethyl indium [$(C_2H_5)_3In$] and the like; a compound wherein 1 to 3 alkyl groups in trialkyl indium are replaced by halogen atoms such as diethyl indium chloride [$(C_2H_5)_2InCl$] and the like; indium halide represented by the formula: InX (X represents a halogen atom) such as indium chloride [InCl]. These may be used independently or in mixture.

Examples of group V raw materials include ammonia, hydrazine, methylhydrazine, 1,1-dimethylhydrazine, 1,2-dimethylhydrazine, t-butylamine, ethylenediamine and the like. These may be used independently or in mixture. Among these, ammonia and hydrazine are preferable. This is because they do not contain carbon in their molecular structure, do not contaminate a semiconductor with carbon.

Examples of substrates on which the group III-V compound semiconductor is grown include sapphire; ZnO; metal borides such as $ZrB_2$; SiC, GaN, AlN. These may be used singly or in combination thereof.

The p-type layer in the compound semiconductor is obtained by doping a p-type dopant on a group III-V compound semiconductor represented by the following formula: $In_gGa_hAl_iN$ (wherein g+h+i=1, 0≦g≦1, 0≦h≦1, 0≦i≦1). As the p-type dopant, a metal such as Mg, Zn and Ca is used. The p-type dopant is preferably fed in form of an organic metal.

For example, the group III-V semiconductor represented by the formula: $p-In_jGa_kN$ (wherein j+k=1, 0<j≦1 and 0≦k<1), which contains In in p-type layer, may be grown at relatively low temperature, for example 650 to 950° C., and may easily prevent thermal degradation of the quantum well structure.

After growing the p-type layer, and before or after a formation of an electrode, annealing may be carried out for the purpose of lowering contact resistance with the electrode. The annealing atmosphere may be an inert gas. Alternatively, it may be substantially a gas containing hydrogen, or a gas containing hydrogen and oxygen. The annealing temperature is usually from 200 to 1,000° C. and preferably from 400 to 800° C.

Between the quantum well layer and the p-type layer, at least one layer represented by the formula: $In_lGa_mAl_nN$ (wherein 1+m+n=1, 0≦l≦1, 0≦m≦1, 0≦n≦1) may be grown as cap layer. When the layer has AlN, thermal resistance of the layer may be improved, and phase separation of the light-emitting layer may be prevented. The cap layer may be doped with a p-type dopant such as Mg, Zn and Ca and/or an n-type dopant such as Si, O, S and Se.

In the MOVPE method for producing the group III-V compound semiconductor of the present invention, a reactor having a conventional structure is used. Examples thereof include a reactor in which a raw material gas may be fed to substrate from upper side thereof, or side thereof. In the reactor, the substrate is placed almost epi-surface-up; as alternation, epi-surface-down. In this case the substrate is placed epi-surface-down, a raw material may be fed from a lower side of the substrate or a side-thereof. The angle of the substrate in the reactors is not necessarily exactly horizontal, may be almost or completely vertical. It may be applied to a reactor in which the arrangements of the substrate and gas feeding in the reactor are applied and in which a plurality of substrate may be grown simultaneously.

The present invention is described in more detail by following examples, which should not be construed as a limitation upon the scope of the present invention.

EXAMPLE 1

A GaN low temperature growth buffer layer having a thickness of about 50 nm was grown on c-plane sapphire substrate at 490° C. from TMG and ammonia as raw materials and with hydrogen as a carrier gas. The feeding of TMG was stopped and the temperature was raised to 1,090° C. An n-type GaN layer having a thickness of about 3 μm was grown from TMG, ammonia and silane as raw materials and with hydrogen as a carrier gas. The feeding of silane was stopped and an undoped GaN layer having a thickness of about 0.3 μm was grown. The feeding of TMG was stopped and the temperature was lowered to 720° C., a GaN layer having a thickness of 15 nm and an InGaN layer having a thickness of 3 nm were repeatedly grown 5 times from TEG, TMI and ammonia as raw materials and with nitrogen as a carrier gas. Detailed growth were carried out as follows: After growing an undoped GaN layer having a thickness of 15 nm from ammonia and TEG, the feeding of TEG was stopped and interrupting growth was made for 3 minutes with feeding ammonia and the carrier gas.

An InGaN layer having a thickness of 3 nm was grown with feeding TMI and TEG. The feeding of TMI and TEG was stopped and interrupting growth was made 15 minutes with feeding ammonia and the carrier gas.

After repeating 5 times growing a GaN layer, interrupting growth, growing an InGaN layer and growing an InGaN layer, an undoped GaN layer having a thickness of 18 nm was grown with feeding TEG and ammonia. After growing the undoped GaN layer, the temperature was raised to 800° C. An AlGaN layer having a thickness of 25 nm was grown with feeding TMA, TEG and ammonia as well as bisethylcyclopentadienyl magnesium as p-type dopant. After growing the AlGaN layer, the feeding of TMA, TEG and bisethylcyclopentadienyl magnesium was stopped, and the temperature was raised to 1,050° C. A p-type GaN having a thickness of 200 nm with feeding of TMG, ammonia and bisethylcyclopentadienyl magnesium as a p-type dopant. A group III-V compound semiconductor was obtained by taking the substrate out from the reactor and annealing at 800° C. for 48 seconds in an ammonia and oxygen-containing nitrogen gas stream.

A satellite reflection from the multiple quantum well structure is measured by x-ray diffraction. An average mole fraction of InN in the multiple quantum well structure was 1.96%. This result indicates an average mole fraction of InN in an InGaN active layer was 11.76%.

A p-electrode made of NiAu and an n-electrode made of Al were formed on the compound semiconductors to obtain a LED. The LED was applied with current of 20 mA in forward direction, exhibited clear blue light. The brightness was 1,795 mcd and wavelength of emitted light was 470.8 nm. According to the wavelength of emitted light, the mole fraction of InN in InGaN active layer was calculated as 29.8%.

EXAMPLE 2

A group III-V compound semiconductor was obtained according to Example 1, except that the interrupting growth after growing the InGaN layer of thickness of 3 nm was changed from 15 minutes to 20 minutes.

A satellite reflection from the multiple quantum well structure is measured by x-ray diffraction. An average mole fraction of InN in the multiple quantum well structure was 1.915%. This result indicates an average mole fraction of InN in an InGaN active layer was 11.49%.

A p-electrode made of NiAu and an n-electrode made of Al were formed on the compound semiconductors to obtain a LED. The LED was applied with current of 20 mA in forward direction, exhibited clear blue light. The brightness was 1175 mcd and wavelength of emitted light was 476 nm. According to the wavelength of emitted light, the mole fraction of InN in InGaN active layer was calculated as 31.1%.

EXAMPLE 3

A GaN low temperature growth buffer layer having a thickness of about 50 nm, an n-type GaN layer having a thickness of about 3 μm and undoped GaN layer having a thickness of about 0.3 μm were grown according to example 1. After stopping the feeding of TMG, the temperature is lowered to 770° C. An GaN layer having a thickness of 15 nm and an InGaN layer having a thickness of 3 nm were grown at 720° C. from TEG, TMI and ammonia as raw materials and with nitrogen as a carrier gas. Detailed growth were carried out as follows: After growing an undoped GaN layer having a thickness of 15 nm from ammonia and TEG, the feeding of TEG was stopped and interrupting growth was made for 3 minutes with feeding ammonia and the carrier gas. An InGaN layer having a thickness of 3 nm was grown with feeding TMI and TEG. The feeding of TMI and TEG was stopped and interrupting growth was made for 15 minutes with feeding ammonia and the carrier gas. Then the feeding of TMI and TEG was stopped and interrupting growth was made for 15 minutes with feeding ammonia and the carrier gas. During interrupting growth, the temperature was raised to 770° C. and a GaN layer was grown again.

After repeating 5 times growing a GaN layer, interrupting growth, growing an InGaN layer and growing an InGaN layer, an undoped GaN layer, AlGaN layer and p-type GaN layer were grown to obtain a group III-V compound semiconductor according to Example 1.

A satellite reflection from the multiple quantum well structure was measured by x-ray diffraction. An average mole fraction of InN in the multiple quantum well structure was 1.53%. This result indicates an average mole fraction of InN in an InGaN active layer was 9.18%.

A p-electrode made of NiAu and an n-electrode made of Al were formed on the compound semiconductors to obtain a LED. The LED was applied with current of 20 mA in forward direction, exhibited clear blue light. The brightness was 3548 mcd and wavelength of emitted light was 482.9 nm. According to the wavelength of emitted light, the mole fraction of InN in InGaN active layer was calculated as 32.5%.

COMPARATIVE EXAMPLE 1

A group III-V compound semiconductor was obtained according to Example 1, except that interrupting growth time after growing InGaN layer having a thickness of 3 nm was changed from 15 minutes to 5 minutes.

A satellite reflection from the multiple quantum well structure is measured by x-ray diffraction. An average mole fraction of InN in the multiple quantum well structure was 3.29%. This result indicates an average mole fraction of InN in an InGaN active layer was 19.74%.

A p-electrode made of NiAu and an n-electrode made of Al were formed on the compound semiconductors to obtain a LED. The LED was applied with current of 20 mA in forward direction, exhibited clear blue light. The brightness was 46 mcd and wavelength of emitted light was 480 nm. According to the wavelength of emitted light, the mole fraction of InN in InGaN active layer was calculated as 31.9%.

COMPARATIVE EXAMPLE 2

A group III-V compound semiconductor was obtained according to Example 1, except that interrupting growth time after growing InGaN layer having a thickness of 3 nm was changed from 15 minutes to 10 minutes.

A satellite reflection from the multiple quantum well structure is measured by x-ray diffraction. An average mole fraction of InN in the multiple quantum well structure was 2.26%. This result indicates an average mole fraction of InN in an InGaN active layer was 13.56%.

A p-electrode made of NiAu and an n-electrode made of Al were formed on the compound semiconductors to obtain a LED. The LED was applied with current of 20 mA in forward direction, exhibited clear blue light. The brightness was 163 mcd and wavelength of emitted light was 464 nm. According to the wavelength of emitted light, the mole fraction of InN in InGaN active layer was calculated as 28.5%.

Figure 2:
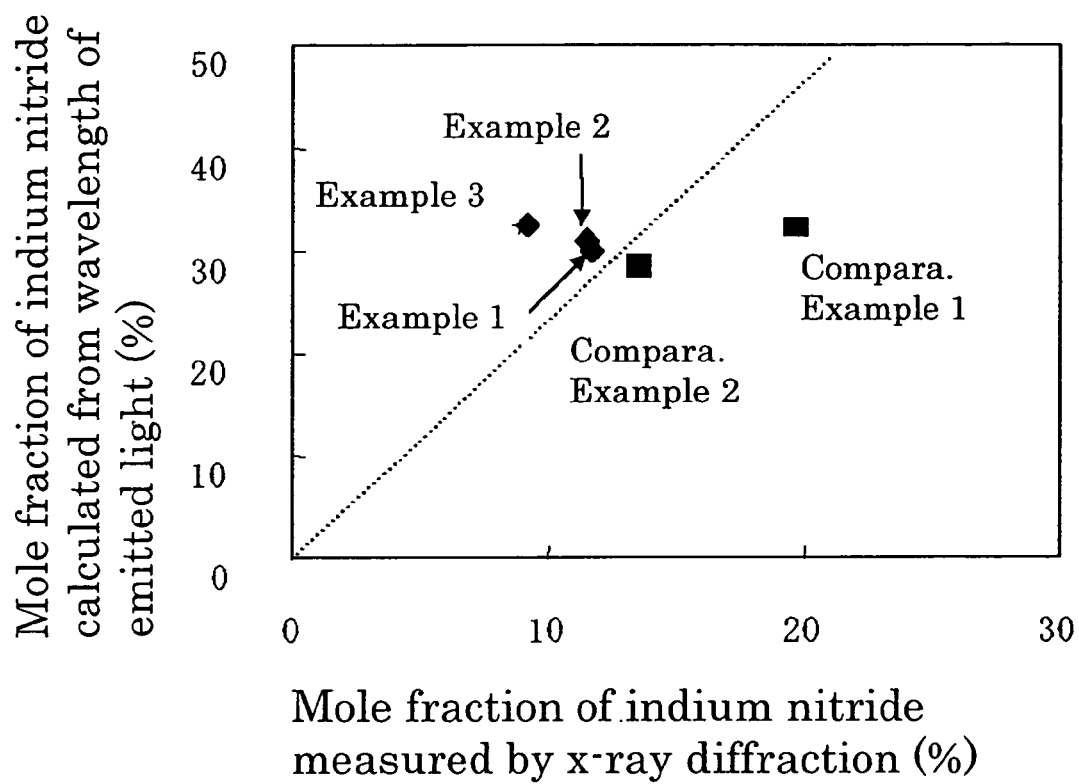
FIG. 2 is a graph showing a relation between an average mole fraction of InN in a light-emitting layer measured by x-ray diffraction and a mole fraction of InN calculated from the wavelength of light emitted due to current injection. A dotted line shows a line where the ratio of a mole fraction of InN calculated from the wavelength of emitted light and a mole fraction of InN measured by x-ray diffraction is 0.425.

In FIG. 2, the results in Examples 1 to 3 as well as Comparative Examples 1 and 2 are plotted with the mole fraction of InN (in percent) calculated from wavelength of emitted light as the ordinate and the mole fraction (in percent) of InN in the multiple quantum well structure measured by X-ray diffraction as the abscissa. The plots for Examples and Comparative Examples shows that a line in which the mole fraction of InN measured by X-ray diffraction is 42.5% clearly separates the mole fraction of InN calculated from the wavelength of emitted light due to current injection.

Figure 3:
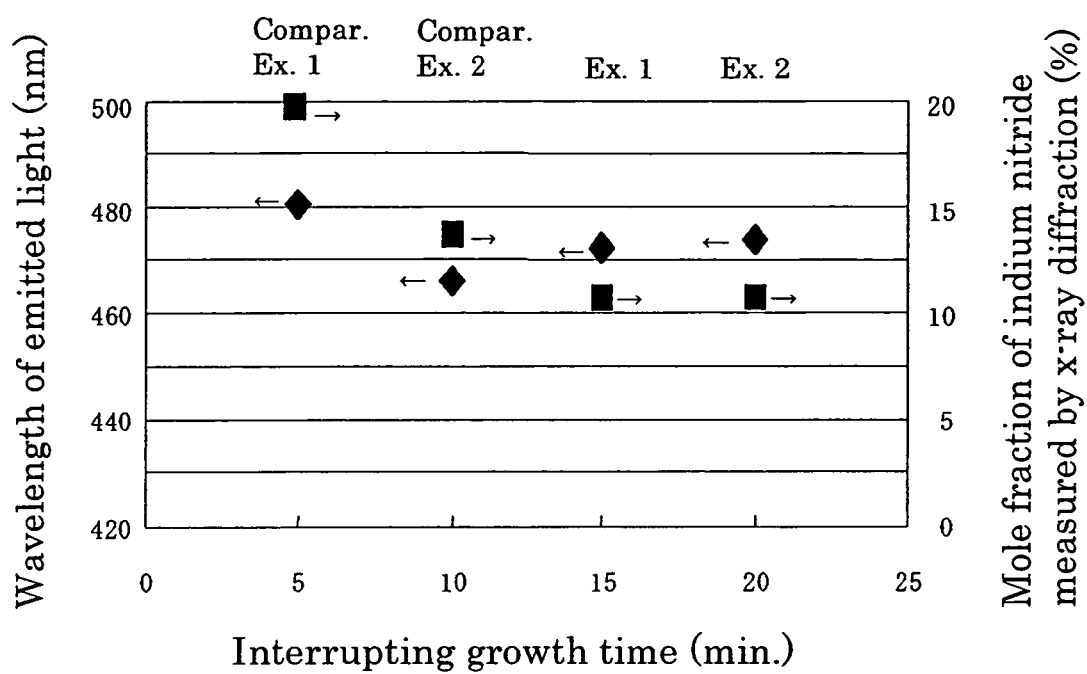
FIG. 3 is a graph showing a relation between a time of interrupting growth and a mole fraction of InN in a light-emitting layer measured by x-ray diffraction, and a relation between a time of interrupting growth and a mole fraction of InN calculated from the wavelength of light emitted due to current injection.

In FIG. 3, the results in Examples 1 and 2 as well as Comparative Examples 1 and 2 are plotted with interrupting growth time between completion of the quantum well layer growth and beginning of the barrier layer growth as the abscissa and the mole fraction of InN in the multiple quantum well structure measured by X-ray diffraction, and the wavelength of light emitted due to current injection as the ordinate. Surprisingly, it shows that almost no change was observed in the wavelength of light emitted by current injection in spite of decrease in the mole fraction of InN measured by X-ray diffraction. This fact shows that A group III-V compound semiconductor having a high brightness is obtained by controlling the mole fraction of InN in an active layer measured by X-ray diffraction, without changing wavelength of emitted light.

INDUSTRIAL APPLICABILITY

The group III-V compound semiconductor according to the present invention has a ratio of an average mole fraction of InN in the quantum well layer, which is measured by x-ray diffraction, to a mole fraction of InN calculated from a wavelength of light emitted from the group III-V compound semiconductor due to current injection is not more than 42.5%, and thus is used as a light-emitting device having a high brightness.

Using the method of the present invention, comprising a step of interrupting growth the quantum well layer between completion of the quantum well layer growth and beginning of the barrier layer growth, at a temperature of growing the quantum well layer at a temperature being equal to or higher than the temperature of growing the quantum well layer for 10 minutes or more, The group III-V compound semiconductor used as a a light-emitting device having a high brightness is obtained.

The invention claimed is:

1. A process for producing group III-V compound semiconductor with two barrier layers and a quantum well structure including a quantum well layer represented by the formula:

$In_xGa_yAl_zN$ (wherein x+y+z=1, 0<x<1, 0<y<1, and 0≦z<1)

between the barrier layers comprising a step of interrupting growth between completion of the quantum well layer growth and beginning growth of an adjacent barrier layer, at a temperature of growing the quantum well layer, for more than 15 minutes.

2. The process for producing a group III-V compound semiconductor according to claim 1, wherein the interrupting step is made without feeding a group III raw material.

3. The process according to claim 1, wherein the barrier layer is made of GaN.

4. The process for producing a group III-V compound semiconductor according to claim 1, wherein said interrupting is from 15 minutes to 60 minutes.

5. A process for producing group III-V compound semiconductor having a quantum well structure including a quantum well layer represented by the formula:

$In_xGa_yAl_zN$ (wherein x+y+z=1, 0<x<1, 0<y<1, and 0≦z<1)

between two barrier layers, said process comprising
growing said quantum well layer;
interrupting growth following completion of said quantum well layer, before commencing growth of the next said barrier layer, for more than 15 minutes up to 60 minutes, while at a temperature of from that for growing the quantum well layer up to 100° C. higher than the temperature for growing said quantum well layer; and then
growing the next said barrier layer.

6. A process according to claim 5, wherein in said semiconductor device includes alternating barrier layers and quantum well layers.

* * * * *